(12) United States Patent
Machida et al.

(10) Patent No.: US 11,011,512 B2
(45) Date of Patent: May 18, 2021

(54) SEMICONDUCTOR DEVICE INCLUDING A NITRIDE LAYER

(71) Applicant: SANKEN ELECTRIC CO., LTD., Niiza (JP)

(72) Inventors: Osamu Machida, Saitama (JP); Yasushi Tasaka, Saitama (JP)

(73) Assignee: SANKEN ELECTRIC CO., LTD., Saitama (JP)

( * ) Notice: Subject to any disclaimer, the term of this patent is extended or adjusted under 35 U.S.C. 154(b) by 0 days.

(21) Appl. No.: 16/495,753

(22) PCT Filed: Sep. 15, 2017

(86) PCT No.: PCT/JP2017/033611
§ 371 (c)(1),
(2) Date: Sep. 19, 2019

(87) PCT Pub. No.: WO2019/053905
PCT Pub. Date: Mar. 21, 2019

(65) Prior Publication Data
US 2020/0111779 A1    Apr. 9, 2020

(51) Int. Cl.
*H01L 27/06* (2006.01)
*H01L 27/088* (2006.01)
(Continued)

(52) U.S. Cl.
CPC ........ *H01L 27/0605* (2013.01); *H01L 27/088* (2013.01); *H01L 29/2003* (2013.01); *H01L 29/41725* (2013.01); *H01L 29/7783* (2013.01)

(58) Field of Classification Search
None
See application file for complete search history.

(56) References Cited

U.S. PATENT DOCUMENTS

| 8,531,233 B2 | 9/2013 | Tasaka |
| 8,624,261 B2 | 1/2014 | Ikeda |

(Continued)

FOREIGN PATENT DOCUMENTS

| JP | 2012190980 A | 10/2012 |
| JP | 2012191454 A | 10/2012 |

(Continued)

OTHER PUBLICATIONS

International Search Report and Written Opinion issued in PCT/JP2016/051383, dated Dec. 19, 2017; ISA/JP.

*Primary Examiner* — J. E. Schoenholtz
(74) *Attorney, Agent, or Firm* — Harness, Dickey & Pierce, P.L.C.

(57) ABSTRACT

A semiconductor device, comprising a nitride semiconductor layer, a switching element, and a driving transistor; the switching element comprises: a first portion of a first electrode formed on the nitride semiconductor layer; a second electrode formed on the nitride semiconductor layer; and a first control electrode formed on the nitride semiconductor layer and located between the first portion of the first electrode and the second electrode; the driving transistor comprises: a second portion of the first electrode formed on the nitride semiconductor layer and connecting the first portions of the adjacent first electrodes to each other; a third electrode formed on the nitride semiconductor layer and transmitting a signal to the first control electrode; and a second control electrode formed on the nitride semiconductor layer and located between the second portion of the first electrode and the third electrode. Therefore, when the switching element is turned off, it can be kept in an off state even if a drain voltage applied to the switching element is subjected to a variation or the like.

8 Claims, 3 Drawing Sheets

(51) Int. Cl.
*H01L 29/20* (2006.01)
*H01L 29/417* (2006.01)
*H01L 29/778* (2006.01)

(56) References Cited

U.S. PATENT DOCUMENTS

| | | |
|---|---|---|
| 8,723,234 B2 | 5/2014 | Takada et al. |
| 9,331,572 B2 | 5/2016 | Inada et al. |
| 2012/0228625 A1 | 9/2012 | Ikeda |
| 2012/0228632 A1 | 9/2012 | Takada et al. |
| 2012/0248565 A1 | 10/2012 | Tasaka |
| 2014/0346569 A1* | 11/2014 | Vielemeyer ......... H01L 27/0281 257/195 |
| 2015/0014746 A1 | 1/2015 | Inada et al. |

FOREIGN PATENT DOCUMENTS

| | | |
|---|---|---|
| JP | 2012222393 A | 11/2012 |
| JP | 2015162625 A | 9/2015 |
| WO | WO-2013161138 A1 | 10/2013 |

\* cited by examiner

SEMICONDUCTOR DEVICE INCLUDING A NITRIDE LAYER

CROSS-REFERENCE TO RELATED APPLICATIONS

This application is a National Stage of International Application No. PCT/JP2017/033611, filed on Sep. 15, 2017.

TECHNICAL FIELD

The present invention relates to a semiconductor device comprising a switching element and a driving transistor.

BACKGROUND OF THE INVENTION

The Group III-V nitride compound semiconductor represented by the gallium nitride (GaN), i.e., the so-called nitride semiconductor has attracted attention. The nitride semiconductor is a compound semiconductor having a general formula represented as $In_xGa_yAl_{1-x-y}N$ (0≤x≤1, 0≤y≤1, x+y≤1) and composed of aluminum (Al), gallium (Ga) and indium (In) as group III elements and nitrogen (N) as a group V element. The nitride semiconductor can form various mixed crystals and can easily form a hetero-junction interface. The hetero junction of the nitride semiconductor has the following characteristics: a high-concentration two-dimensional electron gas layer is generated at the junction interface due to a spontaneous polarization and/or a piezoelectric polarization even under an undoped state. A Field Effect Transistor (FET) employing the high-concentration two-dimensional electron gas layer as carriers has attracted attention as a switching element for high frequency and high power.

A driving transistor is required in the switching element, and it may consider a case where the driving transistor is provided as an independent package and a case where the switching element and the driving transistor are provided as a same package. In the latter case, patent document 1 and the like disclose an example in which a driving transistor is formed of a nitride semiconductor, and a switching transistor and the driving transistor are formed on a same substrate. In the above structure, the semiconductor device can switch at a high speed even in cases where a gate signal is not at a high speed, an output impedance of a gate driving circuit is high, and an influence of a wiring inductance is worried.

In such a semiconductor device, in a case where an excessive current flows through a power line of the semiconductor device, when the connections of wiring, wires, etc. between a source electrode of the switching element and a source electrode of the driving transistor are lengthened, sometimes a parasitic impedance between the source electrode of the switching element and the source electrode of the driving transistor is increased, and the switching element performs a misoperation or oscillation.

The source electrode of the switching element is further connected to a source terminal of the semiconductor device. Here, by causing a connection portion between the source electrode of the driving transistor and the source electrode of the switching element to be as close as possible to a side of the source electrode of the switching element rather than to a side of the source terminal of the semiconductor device, it is possible to divide a power line which allows a main current to flow through the switching element, and a signal line which allows a signal current to flow through an inter-gate-source loop of the switching element. As a result, potential variations in a potential of a source portion of the switching element and a potential of a source portion of the driving transistor can be suppressed, so as to suppress a misoperation or an oscillation of the switching element.

DOCUMENTS OF THE PRIOR ARTS

Patent Document(s)

Patent Document 1: Japanese Patent Laid-Open No. 2012-222393

SUMMARY OF THE INVENTION

The Problem to be Solved by the Present Invention

However, a threshold value of a switching element formed by a nitride semiconductor is low. Thus, in an off state of such a switching element, a difference between an output voltage of a driving transistor and a threshold voltage of the switching element becomes smaller. When the impedance generated in a loop connecting the switching element and the driving transistor increases, the off state of the switching element cannot be maintained due to a variation in a drain voltage of the switching element or the like. Furthermore, sometimes the switching element performs a misoperation or oscillation.

Therefore, the present invention is proposed in view of the above problem, and an object is to provide a semiconductor device capable of suppressing a value of impedance generated in a loop connecting a switching element and a driving transistor.

Means for Solving the Problem

In order to achieve the above object, a semiconductor device of the present invention comprises a nitride semiconductor layer, a switching element, and a driving transistor; the switching element comprises: a first portion of a first electrode formed on the nitride semiconductor layer; a second electrode formed on the nitride semiconductor layer; and a first control electrode formed on the nitride semiconductor layer and located between the first portion of the first electrode and the second electrode; the driving transistor comprises: a second portion of the first electrode formed on the nitride semiconductor layer and connecting the first portions of the adjacent first electrodes to each other; a third electrode formed on the nitride semiconductor layer and transmitting a signal to the first control electrode; and a second control electrode formed on the nitride semiconductor layer and located between the second portion of the first electrode and the third electrode.

Effects of the Present Invention

As described above, the semiconductor device according to the present invention can suppress the value of impedance generated in the loop connecting the switching element and the driving transistor.

Therefore, in the off state of the switching element, the misoperation or oscillation of the switching element can be suppressed.

DETAILED DESCRIPTION OF THE PREFERRED EMBODIMENTS

Hereinafter, the present invention will be described in detail with reference to the drawings as examples of the embodiments, but the present invention is not limited thereto. In addition, a 'connection' described herein further comprises a connection with a load, such as a resistor, an inductor, etc., and any other element, such as a diode• a transistor, etc., interposed therebetween, unless otherwise specified in the claims of the present invention.

Firstly, a semiconductor device according to a first embodiment will be described with reference to FIG. 1. In addition, the cross-sectional view of FIG. 1 is taken along A-A in the top view of FIG. 3.

Figure 1:
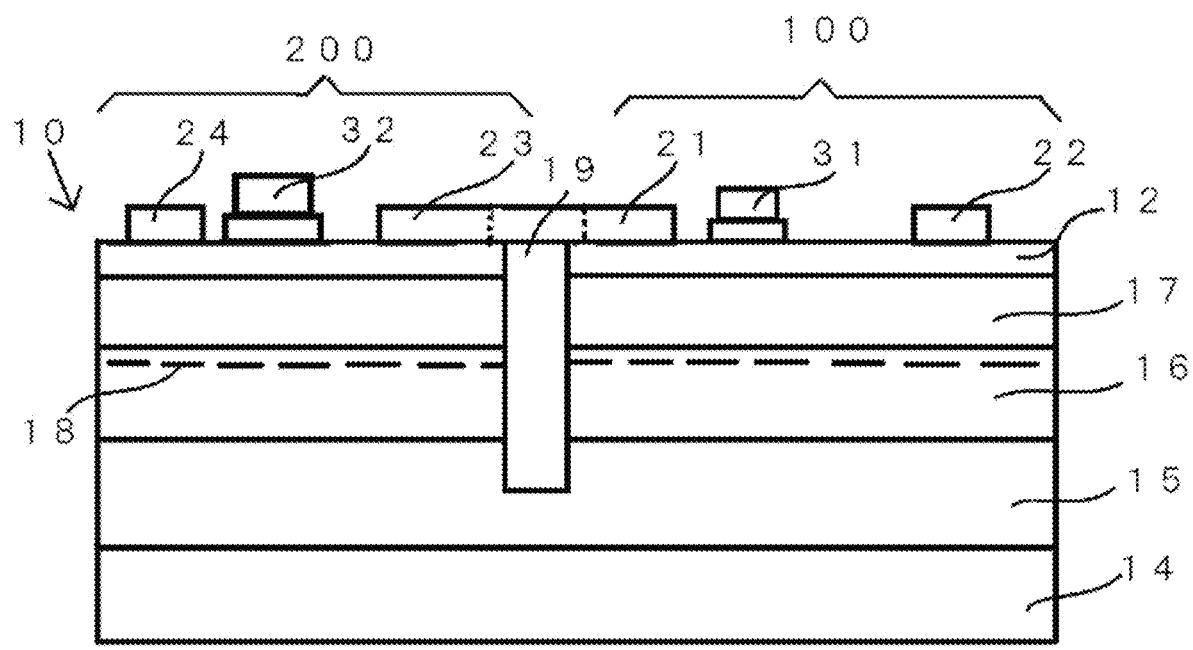
FIG. 1 is a schematic cross-sectional view illustrating a semiconductor device according to a first embodiment.

FIG. 1 is a schematic cross-sectional view illustrating a semiconductor device 10 according to a first embodiment. The semiconductor device 10 of FIG. 1 comprises a substrate 14 made of silicon or silicon carbide; a buffer layer 15 formed on the substrate 14 and made of a nitride semiconductor; a channel layer 16 and a barrier layer 17 that are made of nitride semiconductors; and a two-dimensional electron gas layer 18 generated in a planar expansion manner near an interface with the channel layer 16 and the barrier layer 17. In the semiconductor device 10 of FIG. 1, a gallium nitride (GaN) layer 12 is provided on the barrier layer 17, but the gallium nitride (GaN) layer 12 also may not be formed.

The buffer layer 15 may also be a structure in which aluminum gallium nitride (AlGaN) or aluminum nitride (AlN) is provided on the substrate 14. In addition, the buffer layer 15 may be a multilayer structure in which a first layer made of aluminum nitride (AlN) and a second layer made of aluminum gallium nitride (AlGaN) or gallium nitride (GaN) are repeatedly formed on the substrate 14. In addition, the buffer layer 15 may also be a structure having a concentration gradient in which a composition ratio of aluminum on the substrate 14 decreases stepwise or gradually as approaching the channel layer 16 from a side of the substrate 14.

The channel layer 16 is made of gallium nitride (GaN), and as a nitride semiconductor having a composition different from that of the channel layer 16, the barrier layer 17 is for example made of aluminum gallium nitride (AlxGa1−xN; wherein x is great than 0 and less than 1). A spacer layer made of aluminum nitride (AlN) is interposed between the channel layer 16 and the barrier layer 17. In this case, the semiconductor device 10 has the two-dimensional electron gas layer 18 generated in a planar expansion manner on a side of the channel layer 16 near an interface between the spacer layer and the channel layer 16.

A switching element 100 and a driving transistor 200 are formed in the semiconductor device 10. Between the switching element 100 and the driving transistor 200, there is an element separation structure 19 composed of an ion implantation region or a groove. The element separation structure 19 reaches the channel layer 16 more deeply from an upper surface of the barrier layer 17 than the two-dimensional electron gas layer 18. By providing the element separation structure 19, the two-dimensional electron gas layer 18 in the region of the switching element 100 is separated from the two-dimensional electron gas layer 18 in the region of the driving transistor 200. In addition, in the element separation structure 19, instead of forming a groove, a region in which ions are implanted into the barrier layer 17 without generating the two-dimensional electron gas layer 18 may be formed. In addition, the element separation structure 19 also may not be provided.

Figure 3:
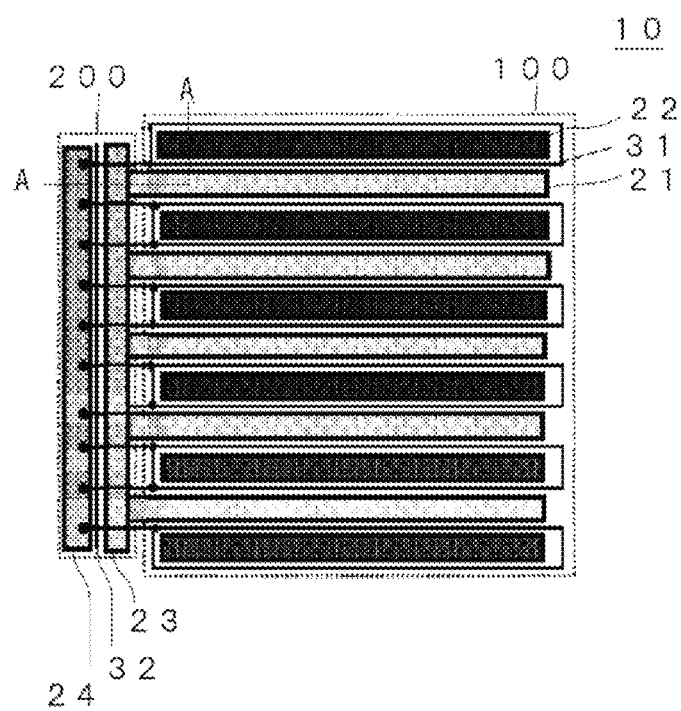
FIG. 3 is a schematic top view illustrating a semiconductor device according to a first embodiment.

The switching element 100 comprises a drain electrode (second electrode) 22 provided on the barrier layer 17 and electrically connected to the two-dimensional electron gas layer 18. In addition, as illustrated in FIG. 3, when the semiconductor device is viewed from above, the switching element 100 is provided with a source electrode (first portion of a first electrode) 21 so as to surround the drain electrode (second electrode) 22. The source electrode (first portion of the first electrode) 21 is provided on the barrier layer 17 and electrically connected to the two-dimensional electron gas layer 18. In addition, a first control electrode 31 is provided on the barrier layer 17 between the drain electrode (second electrode) 22 and the source electrode 21.

The driving transistor 200 comprises a source electrode (second portion of the first electrode) 23 provided on the barrier layer 17 and electrically connected to the two-dimensional electron gas layer 18.

As illustrated in FIG. 3, when the semiconductor device 10 is viewed from above, the source electrode 23 is formed so as to connect end portions of the adjacent source electrodes 21 in a long-side direction to each other. In addition, the source electrode 23 is formed so as to connect left end portions of the adjacent source electrodes 21 in the long-side direction to each other, and a long-side direction (extending direction) of the source electrode 23 is a direction crossing, and preferably perpendicular to, the long-side direction (extending direction) of the source electrode 21. Therefore, as illustrated in FIG. 3, when the semiconductor device 10 is viewed from above, a length from a portion of the source electrode 21, which is a region in which the switching element surrounded by a dotted line functions, to a portion of the source electrode 23, which is a region in which the driving transistor 200 surrounded by a dotted line functions, or a sum thereof becomes shorter.

In addition, the driving transistor 200 has a drain electrode (third electrode) 24 provided on the barrier layer 17 and electrically connected to the two-dimensional electron gas layer 18, and has a second control electrode 32 provided on the barrier layer 17 between the source electrode 23 and the drain electrode 24. As illustrated in FIG. 3, when the semiconductor device 10 is viewed from above, the source electrode 23 is configured more closely to the side of the switching element than the drain electrode 24. Furthermore, a long-side direction (extending direction) of the drain electrode 24 is formed to be extended in a direction perpendicular to a long-side direction (extending direction) of the first control electrode 31.

Therefore, an in-plane deviation of the parasitic impedance generated between the drain electrode 24 and the first control electrode 31 can be suppressed, and the parasitic impedance generated between the drain electrode 24 and the first control electrode 31 can be reduced.

In addition, as illustrated in FIG. 3, when the semiconductor device 10 is viewed from above, the adjacent first control electrodes 31 are connected to each other so as to surround the drain electrode 22.

In addition, as illustrated in FIG. 3, when the semiconductor device 10 is viewed from above, the first control electrode 31 is configured separately from the second control electrode 32 and the source electrode 23 in a portion of the first control electrode 31 crossing the second control electrode 32 and the source electrode 23.

In addition, in the semiconductor device 10 of FIG. 3, the adjacent drain electrodes 22 are connected to each other through wiring not illustrated. In addition, in the semiconductor device 10 of FIG. 3, an output terminal (drain terminal) of the semiconductor device 10 not illustrated is connected to the drain electrode 22 of the switching element 100, an input terminal INL of the semiconductor device 10 not illustrated is connected to the gate electrode 32 of the driving transistor 200, and a source terminal S of the semiconductor device 10 is connected to the source electrode 21 of the switching element 100 at a connection point F as close as possible to the source electrode 21 of the switching element 100.

Figure 2:
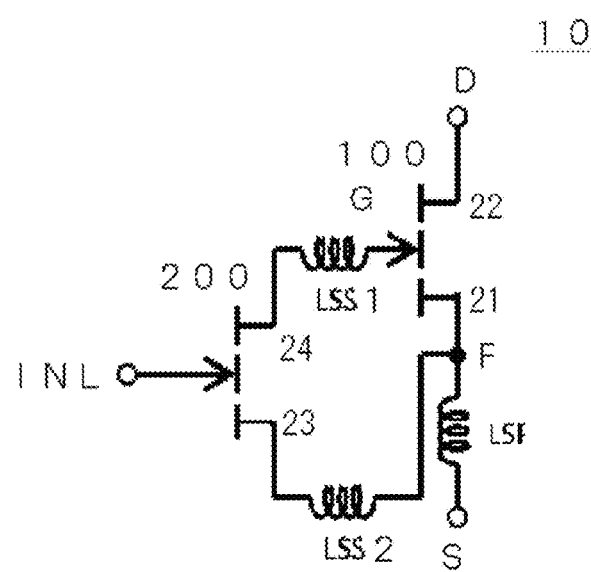
FIG. 2 is a schematic circuit diagram illustrating a semiconductor device according to a first embodiment.

The circuit diagram of FIG. 2 illustrates a circuit structure of such a semiconductor device 10. In the circuit diagram of FIG. 2, D denotes an output terminal (drain terminal) of the semiconductor device 10, INL denotes an input terminal of the semiconductor device 10, and S denotes a source terminal of the semiconductor device 10. The drain terminal D of the semiconductor device 10 is connected to the drain electrode 22 of the switching element 100, and the gate electrode (first control electrode) 31 of the switching element 100 is connected to the drain electrode 24 of the driving transistor 200. The gate electrode (second control electrode) 32 of the driving transistor 200 is connected to the input terminal INL of the semiconductor device 10, and the source electrode 23 of the driving transistor 200 is connected to the source electrode 21 of the switching element 100. Here, a parasitic inductance LSF denotes a parasitic inductance generated between the source electrode 21 of the switching element 100 and the source terminal S of the semiconductor device 10 by providing the connection point F on the side of the electrode 21, a parasitic inductance LSS1 denotes a parasitic inductance generated between the gate electrode 31 of the switching element 100 and the drain electrode 24 of the driving transistor 200, and a parasitic inductance LSS2 denotes a parasitic inductance generated between the source electrode 21 of the switching element 100 and the source electrode 23 of the driving transistor 200. As illustrated in FIG. 3, in the semiconductor device 10, since a length from a source electrode portion of the source electrode 21, which is a region in which the switching element 100 is surrounded by a dotted line, to a source electrode portion of the source electrode 23, which is a region in which the driving transistor 200 is surrounded by a dotted line, is short, the parasitic inductance LSS2 can be reduced. In addition, as illustrated in FIG. 3, in the semiconductor device 10, a direction perpendicular to an extending direction of the first control electrode 31 becomes an extending direction of the drain electrode 24 of the driving transistor 200, and each of the first control electrodes 31 is connected to the drain electrode 24, so that the parasitic inductance LSS1 generated between the drain electrode 24 and the first control electrode 31 can be reduced.

In addition, the connection between the source terminal S of the semiconductor device 10 and the source electrode 21 of the switching element 100 is made to be close to the side of the source electrode 21 of the switching element 100, rather than to the side of the source electrode 23 of the driving transistor 200, so as to divide a power line which allows a main current to flow through the switching element 100, and a signal line which allows a signal current to flow through an inter-gate-source loop of the switching element 100, thereby suppressing potential variations in a potential of the source electrode 21 of the switching element 100 and a potential of the source electrode 23 of the driving transistor 200, and then suppressing a misoperation or oscillation of the switching element 100.

In the circuit diagram of FIG. 2, the drain electrode 24 of the driving transistor 200 outputs High or Low according to a control signal inputted to the input terminal INL, and the output is inputted to the first control electrode 31 of the switching element 100, so that the switching element 100 performs a switching operation. In the off state of the switching element 100, the output voltage of the driving transistor 200 becomes zero volt (0V). Here, when the switching element 100 is composed of a nitride semiconductor, the switching element 100 can perform high-speed switching as compared with a switching element made of other semiconductor material. However, the threshold voltage (Vth) of the switching element 100 composed of the nitride semiconductor is low. As a result, a difference between the threshold voltage of the switching element 100 and the output voltage of the driving transistor 200 in the off state of the switching element 100 becomes smaller. In a semiconductor device having a switching element composed of such a nitride semiconductor, in a case where a large impedance is generated in a loop connecting the switching element and the driving transistor, as in the conventional semiconductor device, the off state of the switching element cannot be kept due to the variation in the drain voltage applied to the switching element 100, etc., and sometimes the switching element performs a misoperation or oscillation.

However, in the semiconductor device 10, since the source electrode 23 is configured to connect the adjacent source electrodes 21 to each other, the length from the source electrode 23 to the source electrode 21 becomes shorter, which can reduce the parasitic inductance LSS2. Thus, the off state of the switching element can be maintained, and the misoperation or oscillation of the switching element can be suppressed. Furthermore, by connecting the source terminal S of the semiconductor device 10 more closely to the side of the source electrode 21 than the source electrode 23, it is possible to divide a power line which allows a main current to flow through the switching element, and a signal line which allows a signal current to flow through an inter-gate-source loop of the switching element, thereby suppressing the misoperation or oscillation of the switching element.

In addition, the source electrode 23 also serves as a connection wiring for the adjacent source electrodes 21, so as to reduce a chip area of the semiconductor device 10.

In addition, each of the first control electrodes 31 is connected to the drain electrode 22 of the driving transistor 200 for example via a via-hole and wiring, so that the impedance (gate impedance of the switching element 100) from the drain electrode 22 to each of the first control electrodes 31 becomes more uniform for the switching element 100, and the misoperation of the semiconductor device 10 can be suppressed In addition, as illustrated in FIG. 3, when the semiconductor device 10 is viewed from above, the driving transistor 200 is provided on a left side of the switching element 100.

However, the adjacent source electrode 21 may also be connected to an end portion on a right side of the long-side direction of the source electrode 21 via the source electrode 23, and the driving transistor 200 may be provided on a right side of the switching element 100. In addition, as illustrated in FIG. 3, when the semiconductor device 10 is viewed from above, the adjacent source electrodes 21 may also be connected to both ends of the source electrodes 21 in the long-side direction via the source electrode 23, and the driving transistor 200 may be provided on both sides of the switching element 100.

Figure 4:
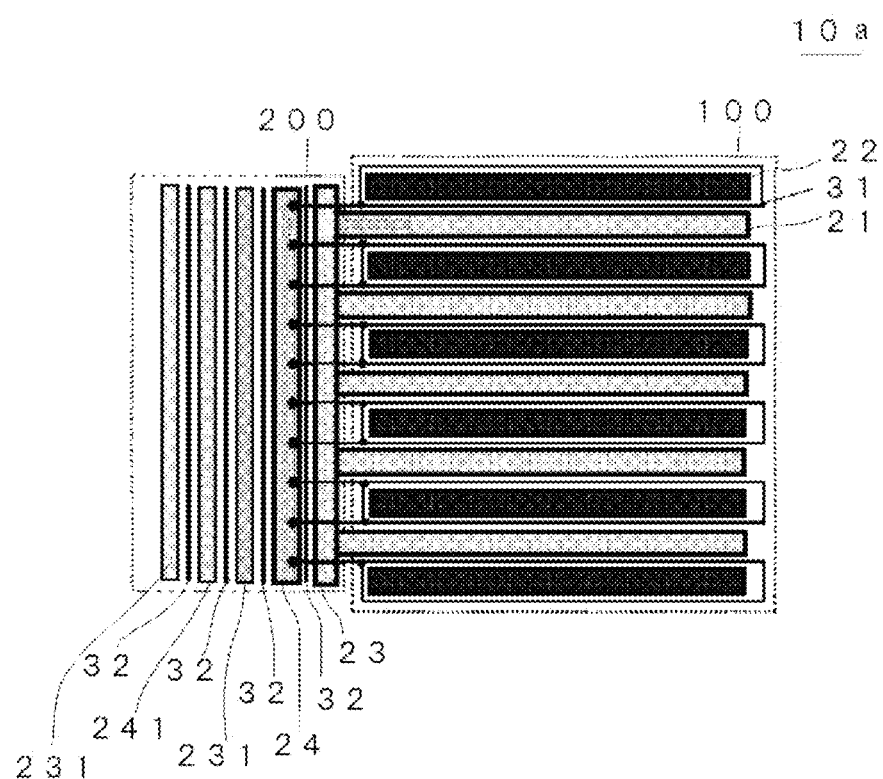
FIG. 4 is a top view of a semiconductor device according to a second embodiment.

Next, a semiconductor device 10a according to a second embodiment will be described with reference to FIG. 4. FIG. 4 is a top view illustrating the semiconductor device 10a according to the second embodiment. The semiconductor device 10a of FIG. 4 has substantially the same structure as the semiconductor device 10 according to the first embodiment illustrated in FIG. 1, and the difference lies in that in the driving transistor 200, the second control electrode 32, the source electrode 231, the second control electrode 32, and the drain electrode 241 are repeated as a unit one or more times on a side opposite to the switching element 100 with respect to the electrode 24, and the second control electrode 32 and the source electrode 231 are configured at the end of the repetition. Here, in the semiconductor device 10a of FIG. 4, the number of repetitions of the unit is 1. The second control electrode 32, the source electrode 231 and the drain electrode 241 are provided on the barrier layer 17 and are electrically connected to the two-dimensional electron gas layer 18.

In addition, in the semiconductor device of FIG. 4, through the wirings not illustrated, the adjacent source electrodes 231 are connected to each other, the adjacent second control electrodes 32 are connected to each other, the adjacent drain electrodes 241 are connected to each other, the source electrodes 23 and 231 are connected to each other, and the drain electrodes 241 and 24 are connected to each other. In the semiconductor device 10a according to the second embodiment, an effect the same as that of the semiconductor device 10 according to the first embodiment can also be achieved.

Figure 5:
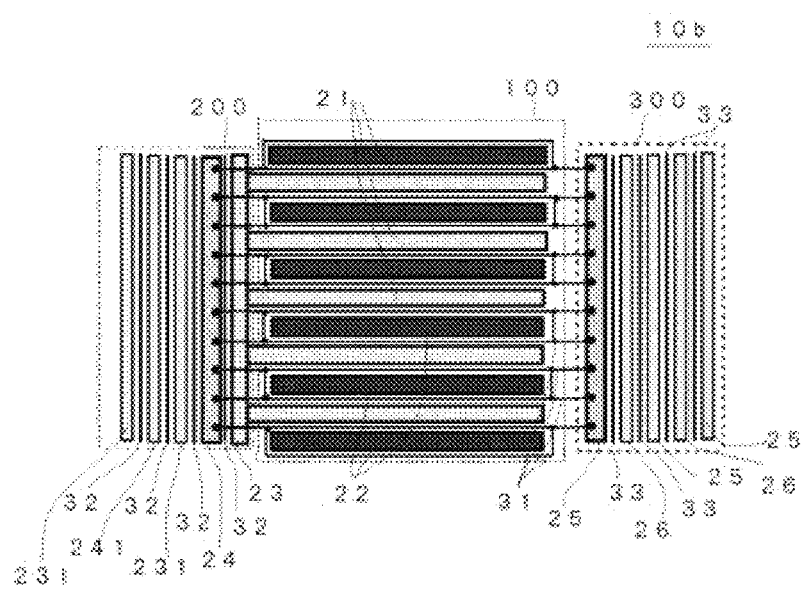
FIG. 5 is a top view of a semiconductor device according to a third embodiment.
Figure 6:
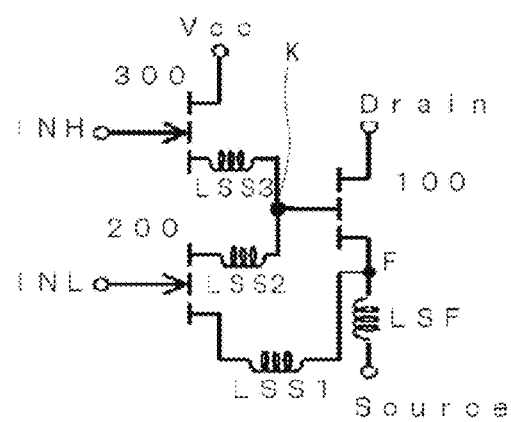
FIG. 6 is a circuit diagram of a semiconductor device according to a third embodiment.
Figure 7:
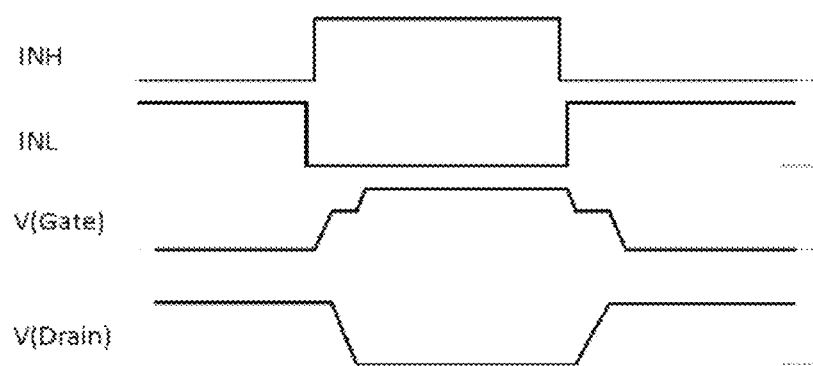
FIG. 7 illustrates a turned-on waveform and a turned-off waveform of a semiconductor device according to a third embodiment.

Next, a semiconductor device 10b according to a third embodiment will be described with reference to FIG. 5. FIG. 5 is a top view illustrating the semiconductor device 10b according to the third embodiment, FIG. 6 is a circuit diagram illustrating the semiconductor device 10b according to the third embodiment, and FIG. 7 illustrates a turned-on waveform and a turned-off waveform of the semiconductor device 10b according to the third embodiment.

The semiconductor device 10b according to the third embodiment is different from the semiconductor device 10a according to the second embodiment in that the driving transistor 300 is provided. As illustrated in FIG. 5, when the semiconductor device 10b is viewed from above, the driving transistor 200 is provided on a left side of the switching element 100, and the driving transistor 300 is provided on a right side of the switching element 100 (a side opposite to the driving transistor 200). The driving transistor 300 comprises a source electrode (fifth electrode) 25 and a drain electrode (sixth electrode) 26 provided on the barrier layer 17 and electrically connected to the two-dimensional electron gas layer 18. In addition, the driving transistor 300 comprises a third control electrode 33 provided on the barrier layer 17 between the source electrode (fifth electrode) 25 and the drain electrode 26.

As illustrated in FIG. 5, when the semiconductor device 10b is viewed from above, the source electrode 25 of the driving transistor 300 is provided on the side of the switching element 100, and the third control electrode 33, the drain electrode 26, the third control electrode 33, and the source electrode 25 are repeated as a unit one or more times on a side opposite to the switching element 100. In FIG. 5, the unit is repeated twice. In addition, in the semiconductor device of FIG. 5, through the wirings not illustrated, the adjacent drain electrodes 22 are connected to each other, the adjacent source electrodes 231 are connected to each other, the adjacent second control electrodes 32 are connected to each other, the adjacent drain electrodes 241 are connected to each other, the source electrodes 23 and 231 are connected to each other, the drain electrodes 241 and 24 are connected to each other, the adjacent source electrodes 25 are connected to each other, the adjacent second control electrodes 32 are connected to each other, and the adjacent drain electrodes 241 are connected to each other.

In the semiconductor device 10b according to the third embodiment, an effect the same as that of the semiconductor device 10 according to the first embodiment can also be achieved.

In addition, as illustrated in FIG. 5, when the semiconductor device 10b according to the third embodiment is viewed from above, an end portion on a left side of each of the first control electrodes 31 is connected to the drain electrode 22 of the driving transistor 200 closest to the side of the switching element, and an end portion on a right side of each of the first control electrodes 31 is connected to the source electrode 25 of the driving transistor 300 closest to the side of the switching element. The source electrode 25 is formed so as to connect end portions of the adjacent first control electrodes 31 in the long-side direction (extending direction) to each other. In addition, the long-side direction (extending direction) of the source electrode 25 becomes a direction perpendicular to the long-side direction (extending direction) of the first control electrode 31. In addition, since the long-side direction of the first control electrode 31 is substantially parallel to the long-side direction of the source electrode 21, the long-side direction (extending direction) of the source electrode 25 becomes a direction perpendicular to the long-side direction (extending direction) of the source electrode 21. Therefore, the length from the source electrode 25 to the first control electrode 31 also becomes shorter, and a connection portion K among the source electrode 25, the first control electrode 31, and the drain electrode 24 is closer to the side of the first control electrode 31 as compared with the side of the drain electrode 24 and the side of the source electrode 25. Thus, as illustrated in the circuit diagram of the semiconductor device 10b in FIG. 6, parasitic inductances LSS2 and LSS3 up to the source electrode 25 can be reduced. As a result, the semiconductor device 10b can suppress potential variations in the potential of the first control electrode 31 of the switching element 100 and the potential of the source electrode 25 of the driving transistor 300. In addition, the switching element can be maintained in the off state by reducing the parasitic inductance LSS2, thereby suppressing the misoperation and oscillation of the switching element.

FIG. 7 illustrates a turned-on waveform and a turned-off waveform of the semiconductor device in FIG. 5. In the semiconductor device according to the third embodiment, an effect the same as that of the semiconductor device according to the first embodiment can be achieved.

In addition, the present invention is not limited to the above embodiments which are just examples, and any manner is included in the technical scope of the present invention, as long as it has substantially the same structure and achieves the same effect as the technical idea described in the claims of the present invention. For example, the present invention also includes a structure in which a contact layer composed of a nitride semiconductor containing a large amount of N-type impurities is provided between the barrier layer 17 and the drain electrode and/or the source electrode.

REFERENCE SIGNS

- 10, 10a, 10b . . . semiconductor device
- 14 . . . substrate
- 15 . . . buffer layer
- 16 . . . channel layer
- 17 . . . barrier layer
- 18 . . . two-dimensional electron gas layer
- 19 . . . element separation structure
- 21 . . . source electrode (first portion of first electrode)
- 22 . . . drain electrode (second electrode)
- 23 . . . source electrode (second portion of first electrode)
- 24 . . . drain electrode (third electrode)
- 31 . . . gate electrode (first control electrode)
- 32 . . . gate electrode (second control electrode)
- 100 . . . switching element
- 200 . . . driving transistor

The invention claimed is:

1. A semiconductor device, comprising a nitride semiconductor layer, a switching element, and a driving transistor,
the switching element comprises:
    a first portion of a first electrode formed on the nitride semiconductor layer;
    a second electrode formed on the nitride semiconductor layer; and
    a first control electrode formed on the nitride semiconductor layer and located between the first portion of the first electrode and the second electrode,
the driving transistor comprises:
    a second portion of the first electrode formed on the nitride semiconductor layer and connected to first portions of first electrodes, which are adjacent to each other;
    a third electrode formed on the nitride semiconductor layer and transmitting a signal to the first control electrode; and
    a second control electrode formed on the nitride semiconductor layer and located between the second portion of the first electrode and the third electrode.

2. The semiconductor device according to claim 1, wherein,
the first control electrode is connected to the third electrode.

3. The semiconductor device according to claim 1, wherein,
the semiconductor device is formed such that a direction perpendicular to a long-side direction of the first portion of the first electrode becomes a long-side direction of the second portion of the first electrode.

4. The semiconductor device according to claim 2, wherein,
the semiconductor device is formed such that a direction perpendicular to a long-side direction of the first portion of the first electrode becomes a long-side direction of the second portion of the first electrode.

5. The semiconductor device according to claim 1, wherein,
a plurality of fourth electrodes, the second control electrodes and the third electrodes are repeatedly configured on the nitride semiconductor layer,
the fourth electrode is electrically connected to the second portion of the first electrode,
the fourth electrode is provided on a side opposite to the switching element with respect to the second portion of the first electrode.

6. The semiconductor device according to claim 2, wherein,
a plurality of fourth electrodes, the second control electrodes and the third electrodes are repeatedly configured on the nitride semiconductor layer,
the fourth electrode is electrically connected to the second portion of the first electrode,
the fourth electrode is provided on a side opposite to the switching element with respect to the second portion of the first electrode.

7. The semiconductor device according to claim 1, wherein,
the driving transistor is a first driving transistor,
the semiconductor device has a second driving transistor, with the switching element interposed between the second driving transistor and the first driving transistor,
the second driving transistor has a fifth electrode formed on the nitride semiconductor layer; a sixth electrode formed on the nitride semiconductor layer; and a third control electrode formed on the nitride semiconductor layer and located between the fifth electrode and the sixth electrode,
the sixth electrode is connected to the first control electrode.

8. The semiconductor device according to claim 2, wherein,
the driving transistor is a first driving transistor,
the semiconductor device has a second driving transistor, with the switching element interposed between the second driving transistor and the first driving transistor,
the second driving transistor has a fifth electrode formed on the nitride semiconductor layer; a sixth electrode formed on the nitride semiconductor layer; and a third control electrode formed on the nitride semiconductor layer and located between the fifth electrode and the sixth electrode,
the sixth electrode is connected to the first control electrode.

* * * * *